(12) United States Patent
Mendenhall (10) Patent No.: US 10,658,997 B2
(45) Date of Patent: May 19, 2020

(54) ENERGY EFFICIENT CLIP LIMITING VOLTAGE CONTROLLED AMPLIFIER

(71) Applicant: RGB Systems, Inc., Anaheim, CA (US)

(72) Inventor: Eric Mendenhall, Trabuco Canyon, CA (US)

(73) Assignee: RGB Systems, Inc., Anaheim, CA (US)

(*) Notice: Subject to any disclaimer, the term of this patent is extended or adjusted under 35 U.S.C. 154(b) by 0 days.

(21) Appl. No.: 16/111,955

(22) Filed: Aug. 24, 2018

(65) Prior Publication Data

US 2020/0067477 A1 Feb. 27, 2020

(51) Int. Cl.
| | |
|---|---|
| H03G 3/30 | (2006.01) |
| H03G 11/00 | (2006.01) |
| H03F 3/183 | (2006.01) |
| H03F 3/21 | (2006.01) |
| H03F 3/45 | (2006.01) |

(52) U.S. Cl.
CPC ............ H03G 11/00 (2013.01); H03F 3/183 (2013.01); H03F 3/21 (2013.01); H03F 3/45475 (2013.01); H03F 2200/03 (2013.01); H03F 2200/129 (2013.01); H03F 2200/66 (2013.01); H03F 2203/45116 (2013.01); H03F 2203/45151 (2013.01); H03F 2203/45528 (2013.01)

(58) Field of Classification Search
CPC .................................. H03G 3/20; H03G 3/30
USPC ............................................. 330/2, 254, 284
See application file for complete search history.

(56) References Cited

U.S. PATENT DOCUMENTS

| | | | | |
|---|---|---|---|---|
| 5,387,877 | A | * | 2/1995 | Robinson ............. H03G 1/0023 330/254 |
| 5,430,409 | A | | 7/1995 | Buck et al. |
| 6,525,604 | B2 | * | 2/2003 | Eckert ................... H03F 1/3211 330/2 |
| 9,065,408 | B2 | | 6/2015 | Mendenhall et al. |
| 2010/0097145 | A1 | | 4/2010 | Sharma |

FOREIGN PATENT DOCUMENTS

| | | |
|---|---|---|
| DE | 33 08 824 | 9/1984 |
| GB | 1 517 948 | 7/1978 |

OTHER PUBLICATIONS

"PA381/PA382, Dual Low Noise VCA", OnChip Systems, 1991, accessed Aug. 10, 2018, 4 pgs.
"LM13700 Dual Operation Transconductance Amplifiers With linearizing Diodes and Buffers", SNOSBW2F—Nov. 1999—Revised Nov. 2015, Texas Instruments Incorporated, www.ti.com, 37 pgs.

(Continued)

*Primary Examiner* — Steven J Mottola
(74) *Attorney, Agent, or Firm* — Knobbe, Martens, Olson & Bear, LLP (57) ABSTRACT

A voltage controlled amplifier with an amplitude limiting circuit, such as a clip limiter, that is separate from the signal path on which the input signal is received by a power amplifier can reduce both noise and power expenditure of the voltage controlled amplifier. The amplitude limiting circuit can include a transistor network that is controlled by a pair of utility operational amplifiers. These utility amplifiers may use less current than the audio amplifier of the voltage controlled amplifier. Further, the transistor network can be deactivated when a signal supplied to the voltage controlled amplifier is below a clipping or other voltage limiting threshold.

19 Claims, 8 Drawing Sheets

(56) References Cited

OTHER PUBLICATIONS

"LM13600 Dual Operational Transconductance Amplifiers with Linearizing Diodes and Buffers", National Semiconductor Corporation, Feb. 1995, 22 pgs.
Partial European Search Report dated Feb. 11, 2020 for European Patent Application No. 19193212.8. 15 pages.

* cited by examiner

ENERGY EFFICIENT CLIP LIMITING VOLTAGE CONTROLLED AMPLIFIER

FIELD OF THE DISCLOSURE

The present disclosure relates to a voltage controlled amplifier. More specifically, the present disclosure relates to an energy efficient clip limiting voltage controlled amplifier.

BACKGROUND

Figure 1A:
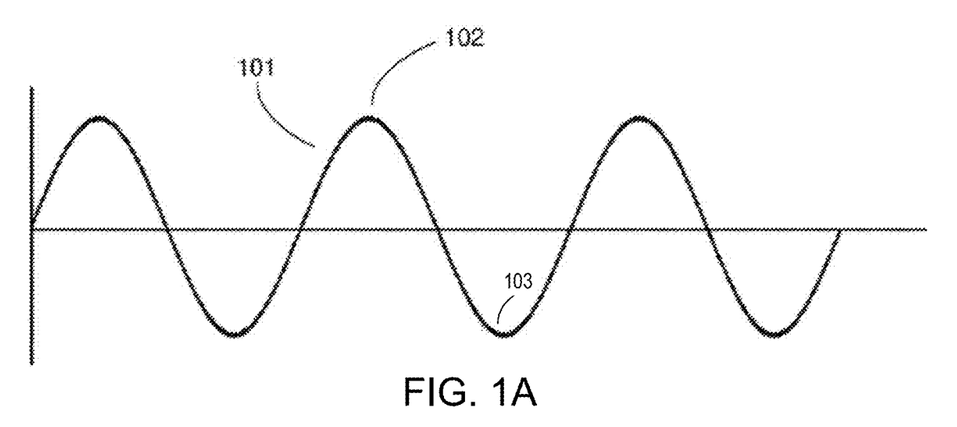
FIG. 1A is a diagram of a sine wave that does not exhibit clipping.
Figure 1B:
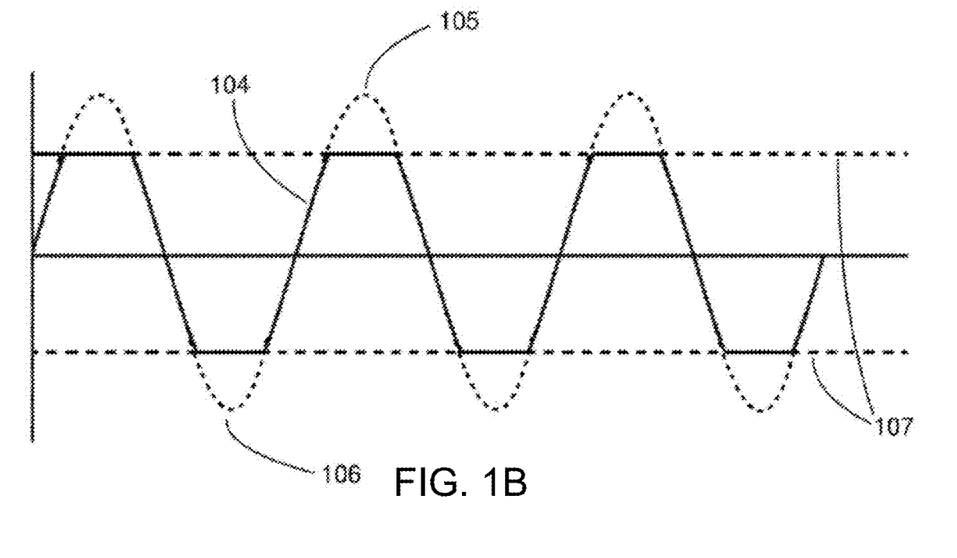
FIG. 1B is a diagram of a sine wave that exhibits clipping of the peaks and troughs.

A problem that often occurs with audio amplification is clipping. Clipping may occur when an amplifier is overdriven by high input signal levels and the amplifier attempts to deliver an output voltage beyond its maximum capability, as shown in FIGS. 1A and 1B. In FIG. 1A, the peaks 102 and troughs 103 of signal 101 are reproduced accurately, so no clipping occurs. In FIG. 1B, the peaks 105 and troughs 106 of signal 104 exceed the maximum output voltage 107 of the amplifier, so the amplitudes of peaks 105 and troughs 106 are clipped to the maximum output voltage 107 causing a distortion in the signal output by the amplifier. In some cases, the distortion may cause undesirable sounds to the listener and/or damage to audio equipment. Accordingly, it is generally desirable to reduce clipping of a signal by an amplifier.

SUMMARY

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Certain embodiments disclosed herein relate to a voltage controlled amplifier. The voltage controlled amplifier may include a power amplifier and an amplitude limiting circuit. The power amplifier may be in a primary signal path. The power amplifier may be configured to receive an input signal transmitted along the primary signal path and to amplify the input signal. The amplitude limiting circuit may be in a secondary signal path that is configured to limit the gain of the power amplifier when active. The amplitude limiting circuit may comprise: a first differential transistor pair of a first type; a second differential transistor pair of a second type, wherein the first differential transistor pair and the second differential transistor pair are configured to attenuate the input signal provided to the power amplifier; and a control circuit configured to control operation of the first differential transistor pair and the second differential transistor pair based at least in part on a control signal, wherein the control signal indicates whether to attenuate the input signal.

In some implementations, the first differential transistor pair comprises NPN transistors and the second differential transistor pair comprises PNP transistors. Further, a quiescent current of the amplitude limiting circuit may be substantially less when the amplitude limiting circuit is not configured to attenuate the input signal than when the amplitude limiting circuit is configured to attenuate the input signal. In some cases, the quiescent current is at least one order of magnitude less when the amplitude limiting circuit is not configured to attenuate the input signal than when the amplitude limiting circuit is configured to attenuate the input signal.

Further, in some implementations, the control circuit receives the control signal from a feedback control circuit that generates the control signal based on a voltage measurement at a summing point of the power amplifier. In some implementations, the control circuit comprises an operational amplifier. The operational amplifier may have a quiescent current that is at least one order of magnitude less than a quiescent current of the power amplifier. In some implementations, the control circuit comprises an operational amplifier based current source. Further, in some cases, the operation amplifier based current source comprises a Howland current source.

Certain additional embodiments disclosed herein relate to an audio amplifier system that includes a power supply and a voltage controlled amplifier. The power supply may be configured to power one or more voltage controlled amplifiers. The voltage controlled amplifier of the audio amplifier system may be one of the one or more voltage controlled amplifiers power by the power supply. Further, the voltage controlled amplifier may comprise: a power amplifier in a first signal path, the power amplifier configured to receive an input signal transmitted along the first signal path and to amplify the input signal; and an amplitude limiting circuit in a second signal path that is configured to limit the gain of the power amplifier when in a first mode, wherein the amplitude limiting circuit comprises: a first differential transistor pair of a first type; a second differential transistor pair of a second type, wherein the first differential transistor pair and the second differential transistor pair are configured to attenuate the input signal provided to the power amplifier; and a control circuit configured to control operation of the first differential transistor pair and the second differential transistor pair based at least in part on a control signal corresponding to the first mode or a second mode.

In some implementations, the amplitude limiting circuit is further configured to not limit the gain of the power amplifier when in the second mode. Further, a quiescent current of the amplitude limiting circuit may be substantially less when operating in the second mode than when operating in the first mode. In addition, the audio amplifier system may further include a feedback control circuit configured to generate the control signal based at least in part on an electrical measurement at a summing point of the power amplifier. With some implementations, the second signal path does not impede communication of the input signal along the first signal path. Moreover, the control circuit may comprise an operational amplifier that controls operation of the first differential transistor pair. The operational amplifier may have a lower quiescent current than the power amplifier.

In yet certain additional embodiments disclosed herein, a method for controlling a voltage controlled amplifier is disclosed. The method may include obtaining a voltage measurement at a summing point of a power amplifier of the voltage controlled amplifier; determining that the voltage measurement satisfies a clipping threshold; providing a control signal to a control input of a voltage limiting circuit of the voltage controlled amplifier, the control signal based at least in part on the voltage measurement; providing a first output signal of the voltage limiting circuit to a non-inverting input of the power amplifier; and providing a second output signal of the voltage limiting circuit to an inverting input of the power amplifier, wherein the first output signal and the second output signal causes an amplitude of an output of the power amplifier to be reduced.

In some implementations, the clipping threshold is set to a first threshold when a set of one or more criteria satisfies a first set of conditions and is set to a second threshold when the set of one or more criteria satisfies a second set of conditions. Further, when the voltage measurement does not satisfy the clipping threshold, the method may further comprise causing the voltage limiting circuit to enter a low-power mode by setting the control signal to a low-power mode value. In addition, when receiving the control signal set to the low-power mode, the voltage limiting circuit may deactivate a transistor network of the voltage limiting circuit, wherein the transistor network generates the first output signal and the second output signal. Moreover, the method may further include generating the first output signal by at least applying an activation signal to a pull down resistor causing a first differential transistor pair to generate the first output signal; and generating the second output signal by at least: inverting the activation signal; and applying the inverted activation signal to a pull up resistor causing a second differential transistor pair to generate the second output signal.

BRIEF DESCRIPTION OF THE DRAWINGS

Throughout the drawings, reference numbers are re-used to indicate correspondence between referenced elements. The drawings are provided to illustrate embodiments of the subject matter described herein and not to limit the scope thereof.

DETAILED DESCRIPTION

Introduction

As described above, clipping can occur when an amplifier attempts to amplify an input signal to a level that is higher than the amplifier can support. When the clipping occurs, the shape of the output signal no longer matches the shape of the input signal, which can result in noise and other undesirable effects. Clipping can be limited with circuitry that detects clipping in an amplifier output signal and reduces the amplitude of the amplifier input signal to a level required to minimize the clipping. In other words, the circuitry can reduce the input signal to a level such that the output signal maintains the same shape as the input signal when gain from the amplifiers applied to the input signal.

Input signal amplitude reduction may be accomplished with a voltage controlled amplifier (VCA) whose gain is controlled by a voltage signal received from the clip detection circuitry. Optionally, a VCA may be implemented using an Operational Transconductance Amplifier (OTA). An OTA is an amplifier whose differential input voltage produces an output current, which produces an output voltage across a resistive load. The gain (Vout/Vin) is controlled by a gain modifying input current, which can be derived from a control voltage connected across a resistor. Accordingly, an OTA can be used as a VCA.

Figure 2:
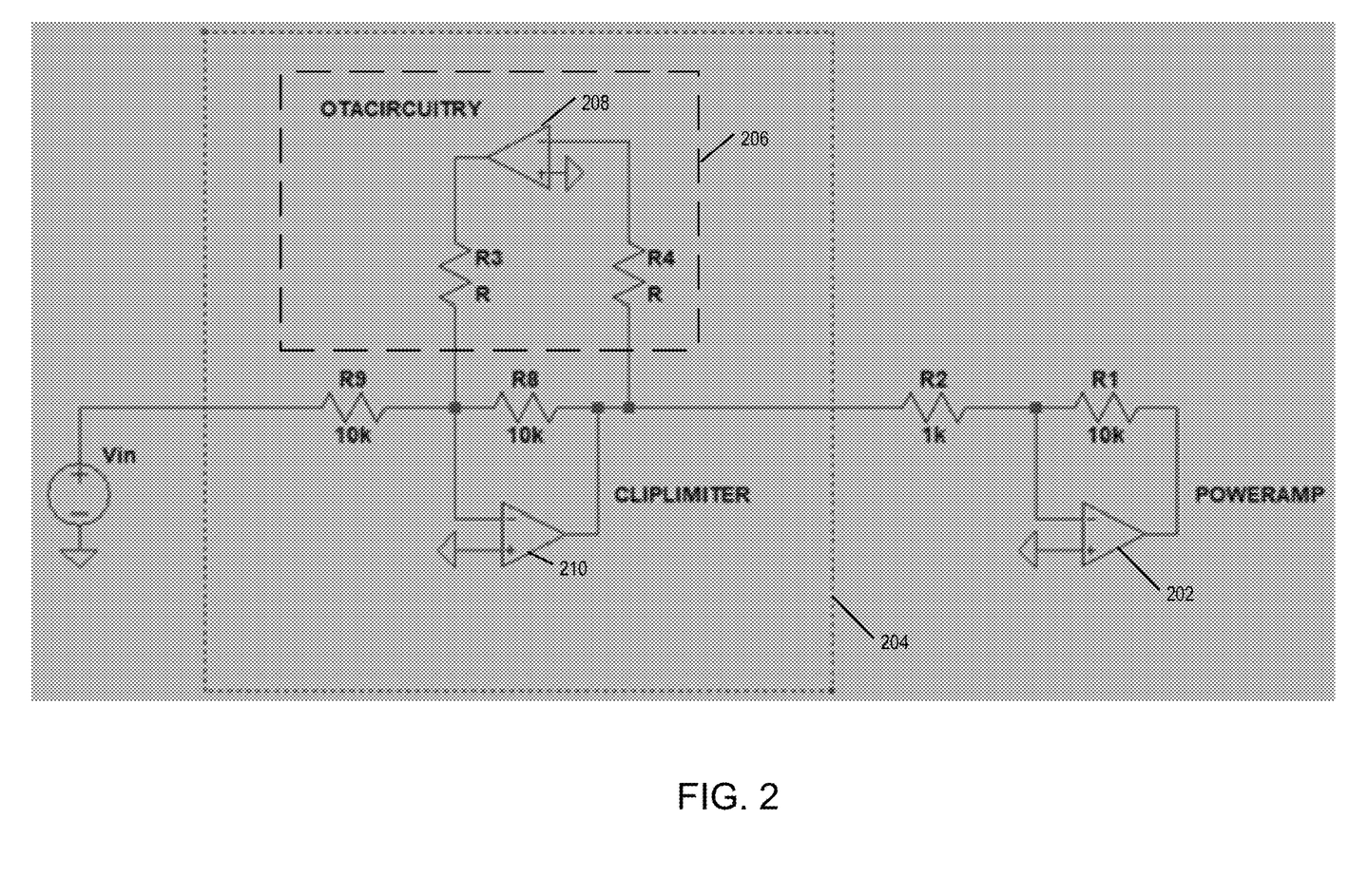
FIG. 2 is a circuit diagram illustrating an example of a power amplifier with a clip limiting circuit.

FIG. 2 is a circuit diagram illustrating an example of a power amplifier 202 with a clip limiting circuit 204 that includes an OTA circuit 206. The OTA circuit 206 is not illustrated in detail, but may include an operational amplifier 208, a number of resistor networks represented by the resistors R3 and R4, and a number of transistors (not shown), which may be configured as current mirrors or differential transistor pairs. The OTA circuit 206 may be used to reduce an amplitude of an input signal (which may be represented by the voltage source Vin) prior to providing the input signal to the power amplifier 202.

In addition to the OTA circuit 206 in the feedback path of the power amplifier, the clip limiting circuit 204 may include additional circuitry, such as the operational amplifier 210, within the feedback path to detect whether the input signal is likely to cause clipping at the power amplifier 202. In certain embodiments, because the clip limiting circuit 204 is within the same communication path has the power amplifier 202, the clip limiting circuit 204 can result in additional noise being added to the input signal prior to the input signal being supplied to the power amplifier 202. This additional noise may in turn be amplified with the input signal by the power amplifier 202. When the input signal is high or strong, the amplitude of the input signal is significantly higher than the amplitude of the noise. As a result, the impact of the additional noise on the power amplifier 202 may be relatively low because, for example, the signal-to-noise ratio is relatively high. However, when the input signal is low, the amplitude of the input signal may be closer to the amplitude of the noise. As a result, the signal-to-noise ratio may be lower and a user may be more likely to detect the additional noise in audio that is output by an audio system that incorporates the system of FIG. 2.

Further, the clip limiting circuit 204 may have a relatively high quiescent current draw. For example, the quiescent current draw of the clip limiting circuit 204 may be approximately 2 mA, or higher. As a result, even when the amplifier is not in use or the input signal is sufficiently low to not cause clipping, the clip limiting circuit 204 may continue to draw 2 mA of current, which can result in wasted power and excessive heat.

Embodiments disclosed herein relate to an energy efficient voltage controlled amplifier. This energy efficient voltage controlled amplifier may be used for audio applications, such as for audio amplifiers. This energy efficient voltage controlled amplifier may include an amplitude limiting circuit, such as a clip limiter, that is separate from the signal path on which the input signal is received by a power amplifier. The signal path upon which a signal to be amplified is communicated to the power amplifier for amplification and then to subsequent circuitry (e.g., a speaker or transmitter, etc.) for processing may be referred to as a primary or main signal path. The amplitude limiting circuit disclosed herein may be part of a separate signal path, which may be referred to as a secondary signal path herein. Advantageously, in certain embodiments, by shifting the amplitude limiting circuit from the primary signal path to a secondary signal path, noise may be removed from the primary signal path and the amount of power consumed by the voltage controlled amplifier may be reduced. In certain embodiments, the power consumed by the voltage controlled amplifier may be reduced because the amplitude limiting circuit may be inactive when an input signal is below a clipping threshold. This clipping threshold may be associated with an amplitude level of an input signal at which clipping may occur when the input signal is provided to the power amplifier. Optionally, the amplitude limiting circuit may continue to use power when a non-clipping input signal is received, but may draw a reduced current compared to when the amplitude limiting circuit is within the primary signal path. Optionally, because the amplitude limiting circuit is removed from the primary signal path, it is possible to use components optimized for low power consumption rather than audio performance in the amplitude limiting circuit resulting in smaller circuitry and lower power requirements compared to existing voltage controlled amplifiers designed for audio applications.

Example Voltage Controlled Amplifier

Figure 3:
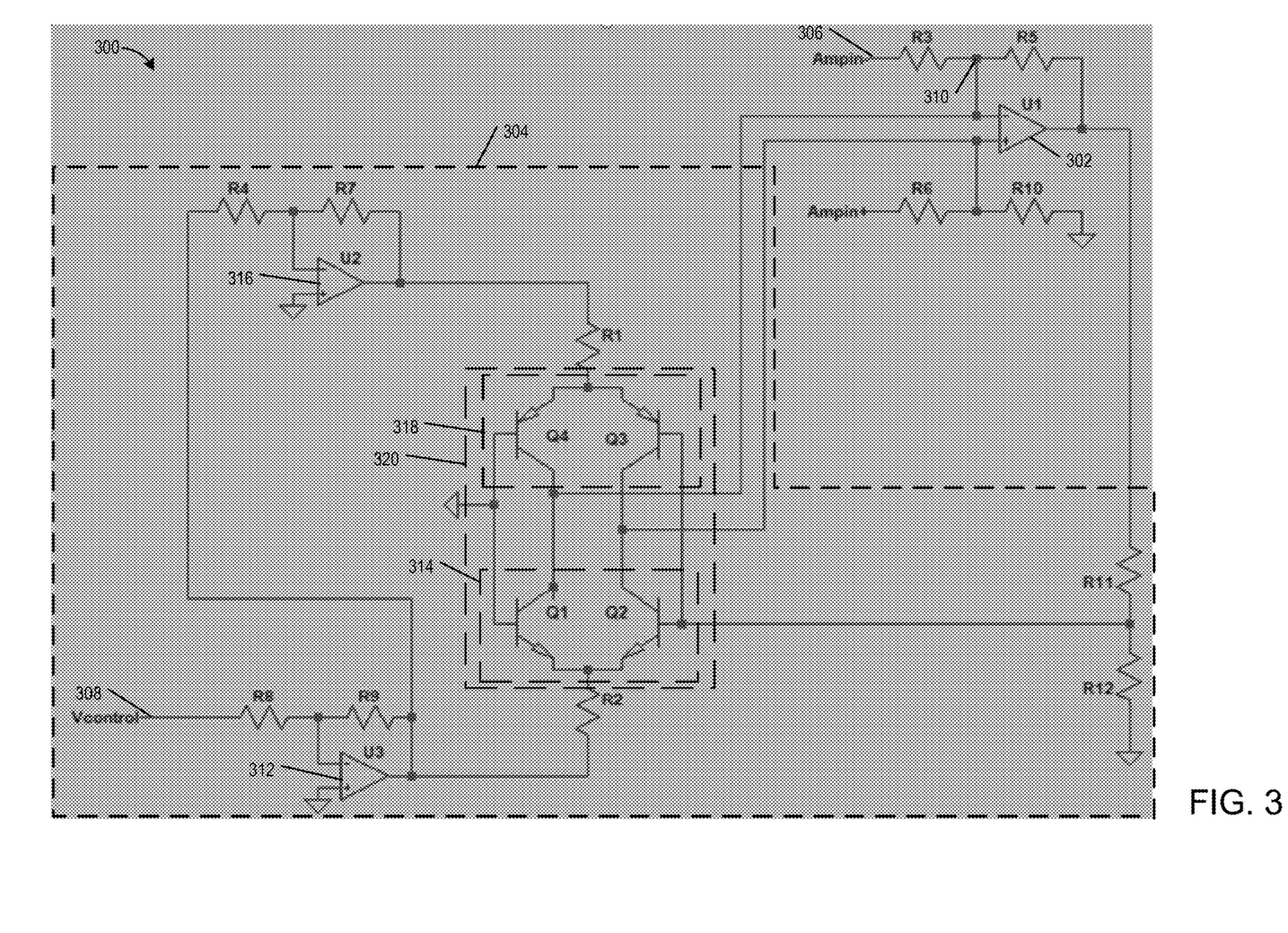
FIG. 3 illustrates an example circuit diagram of a voltage controlled amplifier with an amplitude limiting circuit in accordance with certain embodiments.

FIG. 3 illustrates an example circuit diagram of a voltage controlled amplifier 300 that includes a power amplifier 302 with an amplitude limiting circuit 304 in accordance with certain embodiments. The voltage controlled amplifier 300 may be used in a number of applications including as an audio amplifier circuit that can reproduce low-power electronic audio signals at a level that can be used to drive headphones or speakers.

In the example illustrated in FIG. 3, the amplitude limiting circuit 304, which may be a clip limiter, is not within the same signal path as the signal path that provides the input signal to the power amplifier 302. Thus, the amplitude limiting circuit 304 does not introduce noise to the input signal provided by the amplifier input 306 to the amplifier 302. Further, the amplitude limiting circuit 304 may be configured to not have a quiescent current draw when the input signal is below a clipping threshold. Optionally instead, the amplitude limiting circuit 304 may be configured to have a reduced quiescent current compared, for example, to the clip limiting circuit 204 of FIG. 2. For example, amplitude limiting circuit 304 may have a quiescent current of approximately 0.2 mA, which is at least an order of magnitude less than the quiescent current of the clip limiting circuit 204.

The amplitude limiting circuit 304 may include a control input 308 that receives a control signal for controlling the state of the amplitude limiting circuit 304. The state may be an active or inactive state. Optionally, the state may include a low-power state instead of or in addition to the inactive state. The control signal received at the control input 308 may be received from a control circuit (illustrated in FIG. 4). Optionally, the control signal may be from or based on a measurement of the voltage at a summing point or summing node 310 of the power amplifier 302.

The control signal may be provided to an inverting input of an operational amplifier 312. This operational amplifier 312 may be a differential amplifier. The output signal of the operational amplifier 312 may be provided to a pull-down resistor R2. When the control signal is high the output of the operational amplifier 312 will be low because the control signal is supplied to the inverting input of the operational amplifier 312. When the output of the operational amplifier 312 is low, it may cause the pull-down resistor R2 to be pulled towards ground, which may cause a current to flow through the differential transistor pair 314 comprising the transistors Q1 and Q2. In contrast, when the control signal is low, the output signal of the operational amplifier 312 will be high, and the transistors Q1 and Q2 of the transistor pair 314 will be off. The differential transistor pair 314 may be NPN type transistors. Further, the differential transistor pair 314 may comprise bipolar junction transistors (BJTs). The high signal may be an analog voltage that has a value or a maximum value above a particular threshold voltage. Further, the high signal may be closer in value to a supply voltage, or other maximum voltage, than to ground. In contrast, the low signal may be an analog voltage that has a value or a maximum value below the high signal threshold voltage, or below a second threshold voltage that may be lower than the high signal threshold voltage. Further, the low signal may be closer in value to a minimum voltage or to ground than to a supply voltage.

Further, the output of the operational amplifier 312 may be provided to an inverting input of a second operational amplifier 316. As with the amplifier 312, the operational amplifier 316 may be a differential amplifier. Further, the output of the amplifier 316 may be provided to a pull-up resistor R1. The output signal of the operational amplifier 316 may be an inverted version of the output of the amplifier 312. Thus, when the control signal is high, the output of the operational amplifier 316 will also be high because the operational amplifier 316 will invert the output of the amplifier 312, which as explained above will be low when the control signal is high. When the output of the operational amplifier 316 is high, it may cause the pull-up resistor R1 to be pulled up towards Vin or a supply voltage, which may cause a current to flow through the differential transistor pair 318 comprising the transistors Q3 and Q4. When the current is flowing through the transistor network 320, the amplitude limiting circuit 304 may limit the voltage gain of the power amplifier 302 reducing the occurrence of clipping. In contrast, when the control signal is low, the output signal of the operational amplifier 316 will be high, and the transistors Q3 and Q4 of the transistor pair 318 will be off. The differential transistor pair 318 may be PNP type transistors. Further, the differential transistor pair 318 may comprise BJTs.

Together, the differential transistor pairs 314 and 318 may be referred to as a transistor network 320. When the signal provided to the control input 308 is high causing current to flow through the differential transistor pairs 314 and 318, output signals from the transistor network 320 may be provided to the inverting and noninverting inputs of the power amplifier 302 causing the input signal received from the amplifier input 306 to be attenuated. By attenuating the input signal provided to the power amplifier 302, the occurrence of clipping can be reduced or eliminated. Further, in certain embodiments, because the amplitude limiting circuit 304 does not supply an output signal to the power amplifier 302 when clipping is not occurring (which may be referred to as "normal" operation or non-clipping operation), noise is not introduced into the input signal when clipping is not occurring. Moreover, although in some cases some noise may be introduced into the input signal when clipping is occurring, because the input signal is relatively high (e.g., high enough to cause clipping in the power amplifier 302) the increase noise that may be applied to the input signal is relatively negligible and is typically not detectable by a listener. In some implementations, the voltage divider formed from the resistors R11 and R12 may reduce the amplifier output voltage and apply it to the differential transistor pairs 314 and 318 inputs. The differential transistor pairs 314 and 318 may function as multipliers, with the output current being a function of the differential input voltage and the collector current. In some cases, the output current is proportional to the differential input voltage multiplied by the collector current. The collector currents may be determined by the control voltage, Vcontrol, supplied to the control input 308. The output currents may be applied to the power amplifier 302, which may result in a reduction in the output amplitude of the power amplifier 302. In one non-limiting example, Ampin+=0 volts, the current flowing through R3 equals Ampin−/R3, and the current flowing through R5 equals Vout/R5. In this non-limiting example, if the gain is reduced by 20%, the current flowing through R5 is also reduced 20%, with the missing current being supplied by the transistor network 320.

Advantageously, in certain embodiments, because the amplifiers 312 and 316 are not within the signal path of the input signal provided at the amplifier input 306, the amplifiers 312 and 316 can be optimized for low power consumption rather than audio performance. By using the amplifiers optimized for low power consumption rather than audio performance, the size of the amplifiers can be reduced and the amount of power used may also be reduced compared to amplifiers used in other amplitude limiting circuits or clip limiters, such as the amplifiers 208 and 210 used in the clip limiter 204. For example, in some cases, the amplifiers 208 and 210 may require or use up to 2 mA of current. In contrast, the amplifiers 312 and 316 may require or use 100 µA of current. Thus, the quiescent current may be at least an order of magnitude less for the amplitude limiting circuit 304 than the clip limiter 204. Thus, in certain embodiments, the amplifiers 312 and 316 of the amplitude limiting circuit 304 may use 20 times less power than the amplifiers of the clip limiter 204. Moreover, in certain embodiments, because the amplitude limiting circuit 304 is not within the signal path of the input signal provided at the amplifier input 306, the amplitude limiting circuit 304 may be inactive or in a low-power mode when clipping is not occurring enabling a further reduction in power use. For example, while the quiescent current draw of the clip limiter 204 may be as much as 2 mA or more, the quiescent current draw of the amplitude limiting circuit 304 may be as low as 0.2 mA or less. In the low-power mode, the amplifiers 312 and 316 may continue to draw a minimal amount of current. However, other circuitry of the amplitude limiting circuit 304 may be in active during the low-power mode. The amplifiers 312 and 316 may form control circuitry for the amplitude limiting circuit. For example, the amplifiers 312 and 316 may be used to control the transistor network 320.

Figure 4:
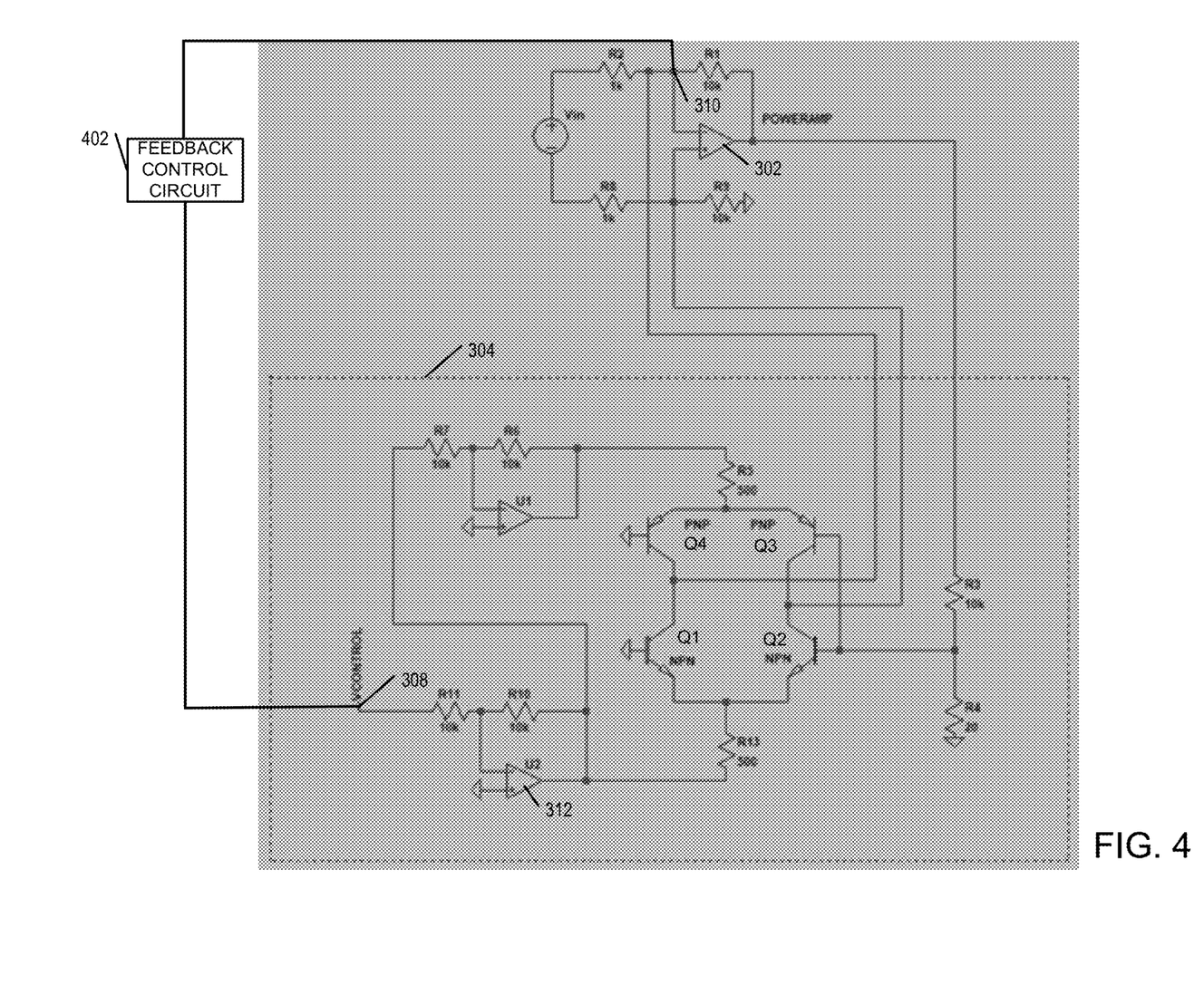
FIG. 4 illustrates an example circuit diagram of the voltage controlled amplifier of FIG. 3 with a feedback control circuit in accordance with certain embodiments.

FIG. 4 illustrates an example circuit diagram of the voltage controlled amplifier of FIG. 3 with a feedback control circuit 402 in accordance with certain embodiments. Although drawn slightly differently, the voltage controlled amplifier of FIG. 4 is the same as that illustrated in FIG. 3. In some implementations, the feedback control circuit 402 is separate from the amplitude limiting circuit 304. In other implementations, the feedback control circuit 402 may be included as part of the amplitude limiting circuit 304. Further, in some implementations, the amplifiers 312 and 316 may be included as part of the feedback control circuit 402 or may be separate from the feedback control circuit 402.

The feedback control circuit 402 may measure the input signal at the summing node 310 of the power amplifier 302. Based on the measurement of the input signal, the feedback control circuit 402 can determine whether the input signal exceeds (or in some cases matches) a clipping threshold. This clipping threshold may be a voltage at which clipping occurs when the input signal exceeds the voltage. Alternatively, or in addition, this clipping threshold may be a voltage at which clipping occurs when an output of the power amplifier 302 exceeds the voltage. When the feedback control circuit 402 determines that clipping is occurring based on the measurement obtained at the summing node 310, the feedback control circuit 402 provides a signal to the control input 308 of the amplitude limiting circuit 304 causing the amplitude limiting circuit 304 to attenuate the input signal so as to limit the occurrence of clipping at the power amplifier 302. As previously described, the signal provided to the control input 308 may be a signal which is provided to the inverting input of the operational amplifier 312. The clipping threshold may be set by a manufacturer. Optionally, the clipping threshold may be determined based on specific capabilities of the power amplifier 302 or the quality of the power amplifier 302. Because of variations during manufacture, in some cases, different power amplifiers 302 of the same type may have different clipping thresholds. Optionally, a register may be provided within the feedback control circuit 402 that enables a user to adjust the clipping threshold by, for example, modifying the register within the feedback control circuit 402.

Although primarily described with respect to clipping, optionally, the amplitude limiting circuit 304 may be used to limit an amplitude of an output signal of the power amplifier 302 based on one or more alternative or additional criteria. For example, in some cases, the feedback control circuit 402 may be configured to cause the amplitude limiting circuit 304 to attenuate input signal provided to the power amplifier 302 when a detected temperature exceeds a particular value regardless of whether clipping will occur with the input signal. Optionally, different clipping thresholds may be provided for different use cases or based on one or more different criteria. For example, continuing the previous example, different clipping thresholds may be used for different ambient temperatures or for different temperatures of the voltage controlled amplifier circuit that includes the power amplifier 302. Additional criteria that may be used to determine the clipping threshold and/or whether to reduce the amplitude of the input signal can include: power or energy use, load, speaker quality or specifications of speakers connected to the amplifier, and the like.

Additional Embodiments

A number of additional example embodiments exist for the amplitude limiting circuit 304. Several of these example embodiments are described below with respect to FIGS. 5-7. The additional example embodiments described with respect to the FIGS. 5-7 may include one or more of the advantages previously described with respect to the voltage controlled amplifier 300.

Figure 5:
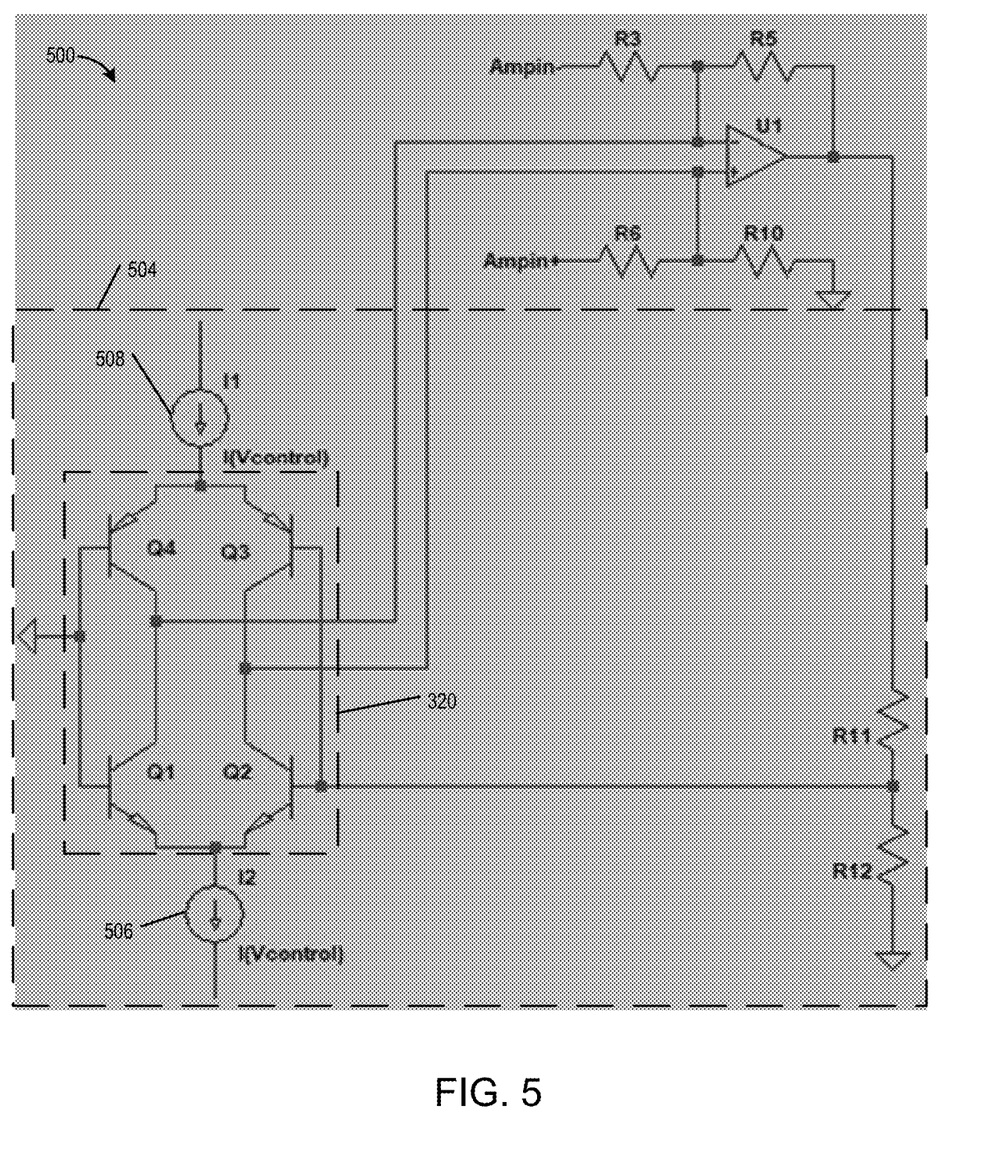
FIG. 5 illustrates an example circuit diagram of a voltage controlled amplifier with an amplitude limiting circuit that includes a current source controller in accordance with certain embodiments.

FIG. 5 illustrates an example circuit diagram of a voltage controlled amplifier 500 with an amplitude limiting circuit 504 that includes a current source controller in accordance with certain embodiments. The voltage controlled amplifier 500 is similar to the voltage controlled amplifier 300 and may include one or more embodiments of the voltage controlled amplifier 300. However, optionally, the amplitude limiting circuit 504 of the voltage controlled amplifier 500 may replace the combination of operational amplifiers, and pull-up and pull-down resistors with a pair of current sources 506 and 508, which may make up the current source controller. The current sources 506 and 508 may be controllable current sources that supply the current to the transistor network 320 based on a control signal that can be provided by the feedback control circuit 402 previously described with respect to FIG. 4.

Figure 6:
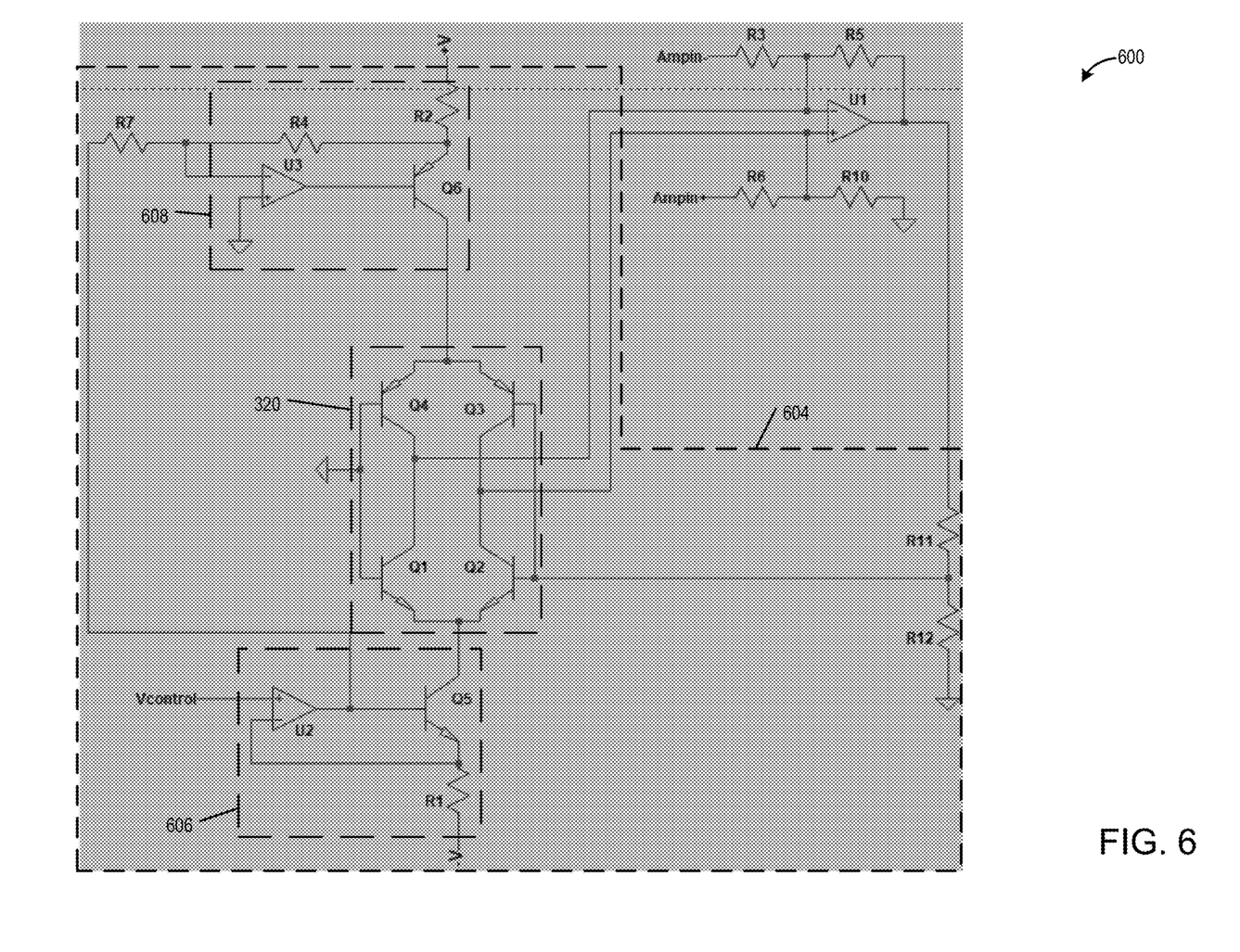
FIG. 6 illustrates an example circuit diagram of a voltage controlled amplifier with an amplitude limiting circuit that includes an op-amp based current source controller in accordance with certain embodiments.

FIG. 6 illustrates an example circuit diagram of a voltage controlled amplifier 600 with an amplitude limiting circuit 604 that includes an op-amp based current source controller in accordance with certain embodiments. The voltage controlled amplifier 600 is similar to the voltage controlled amplifier 300 and may include one or more embodiments of the voltage controlled amplifier 300. Further, similar to the voltage controlled amplifier 500, the voltage controlled amplifier 600 includes an amplitude limiting circuit 604 that replaces the operational amplifiers, and pull-up and pull-down resistors of the voltage controlled amplifier 300 with a current source based control circuitry. This current source based control circuitry may include a pair of operational amplifier based current sources 606 and 608 in place of the current sources 506 and 508 of the voltage controlled amplifier 500. As with the current sources 506 and 508, the op amp based current sources 606 and 608 may be controllable current sources that supply a current to the transistor network 320 based on a control signal that can be provided by the feedback control circuit 402 previously described with respect to FIG. 4.

Figure 7:
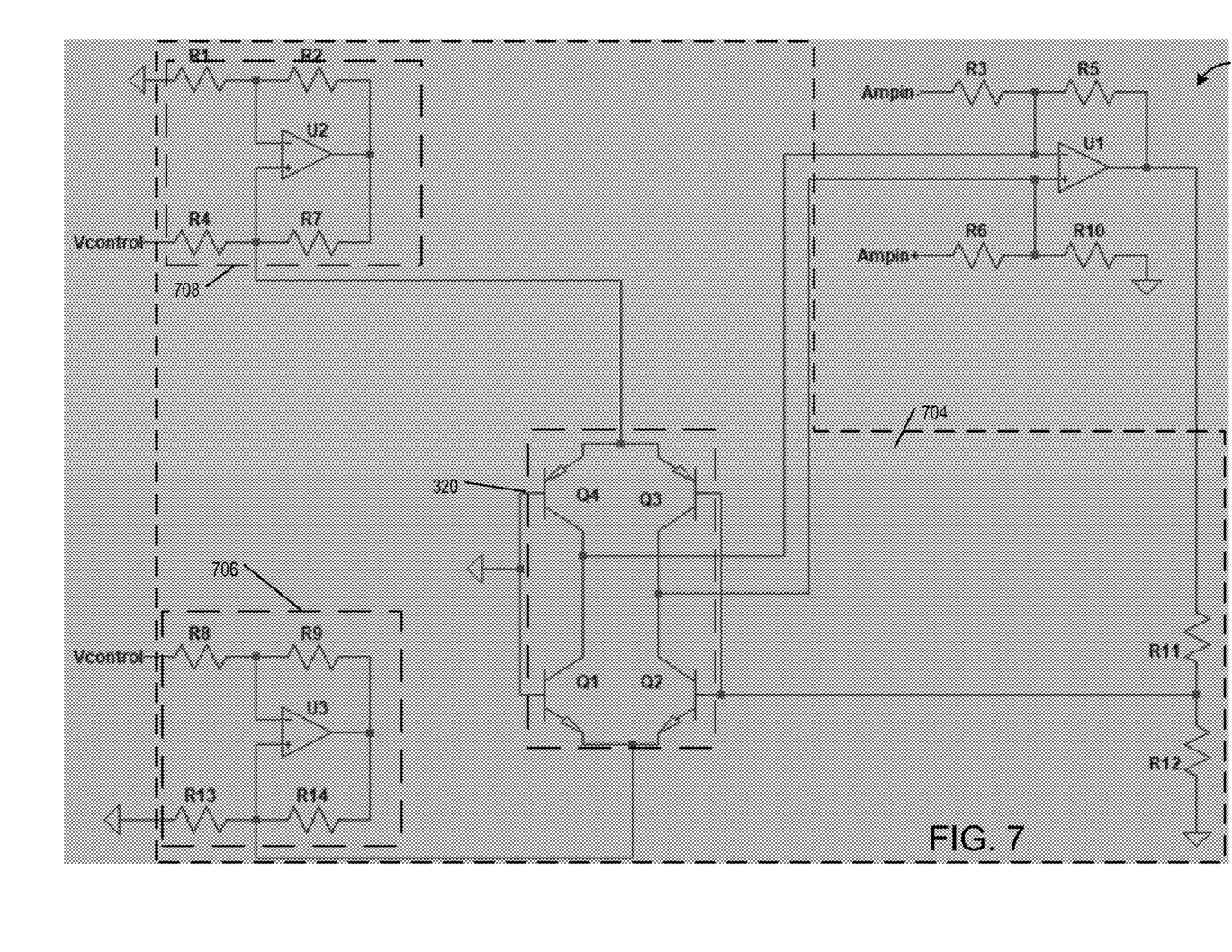
FIG. 7 illustrates an example circuit diagram of a voltage controlled amplifier with an amplitude limiting circuit that includes a Howland based current source controller in accordance with certain embodiments.

FIG. 7 illustrates an example circuit diagram of a voltage controlled amplifier 700 with an amplitude limiting circuit 704 that includes a Howland based current source controller in accordance with certain embodiments. The Howland based current source controller may use an operational amplifier based variable current source or sink. In some implementations, the amplitude limiting circuit 704 may have increased complexity and reduced efficiency compared to the amplitude limiting circuit 304. The voltage controlled amplifier 700 is similar to the voltage controlled amplifier 300 and may include one or more embodiments of the voltage controlled amplifier 300. Further, similar to the voltage controlled amplifier 500, the voltage controlled amplifier 700 includes an amplitude limiting circuit 704 that replaces the operational amplifiers, and pull-up and pull-down resistors of the voltage controlled amplifier 300 with a current source based control circuitry. This current source based control circuitry may comprise a pair of Howland based current 706 and 708 in place of the current sources 506 and 508 of the voltage controlled amplifier 500. As with the current sources 506 and 508, the Howland based current sources 706 and 708 may be controllable current sources that supply a current to the transistor network 320 based on a control signal that can be provided by the feedback control circuit 402 previously described with respect to FIG. 4.

Example Clip-Limiting Voltage Control Process

Figure 8:
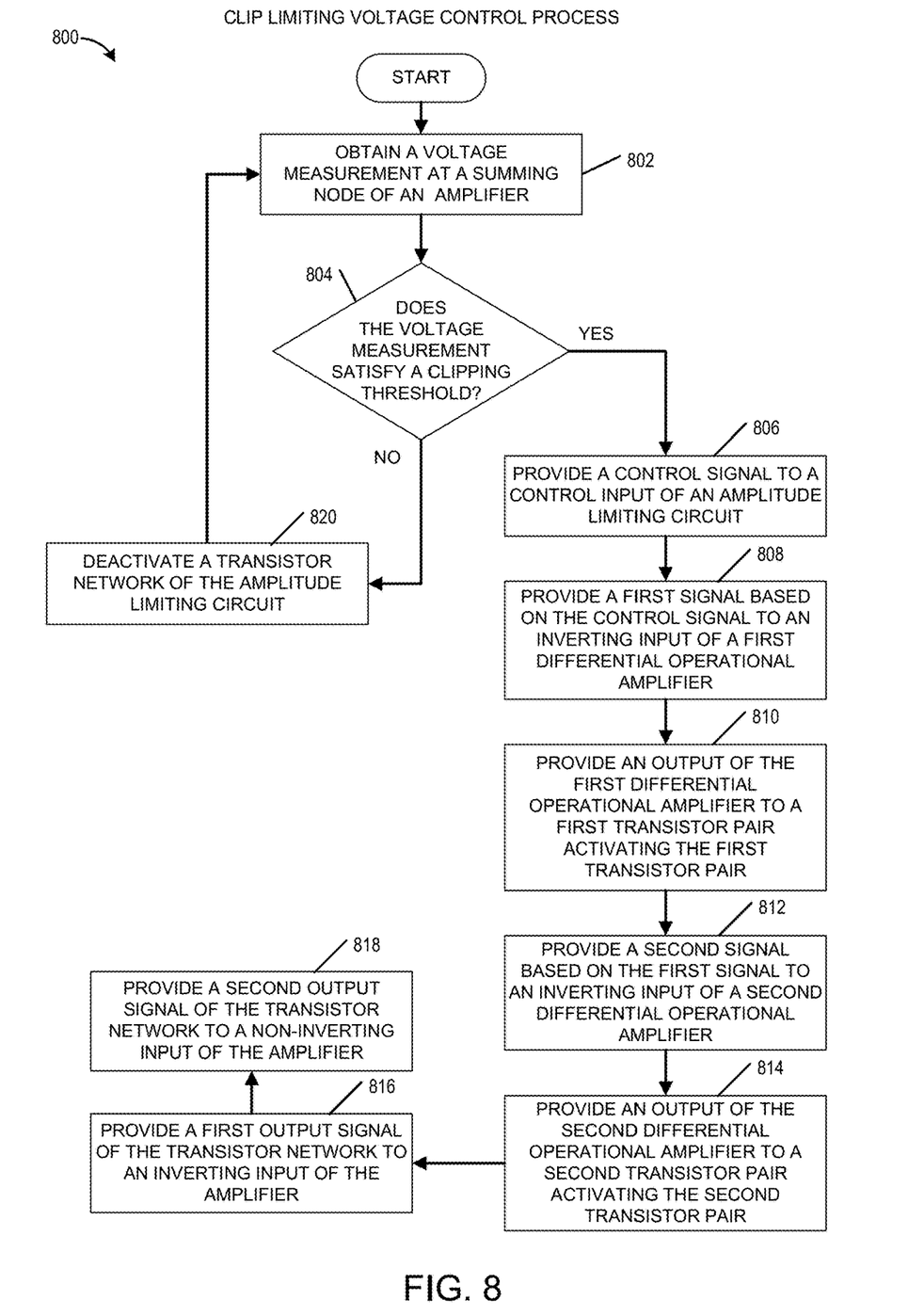
FIG. 8 presents an example flow diagram of a clip-limiting voltage control process in accordance with certain embodiments.

FIG. 8 presents an example flow diagram of a clip-limiting voltage control process 800 in accordance with certain embodiments. Some or all of the process 800 can be implemented by voltage controlled amplifier that includes or communicates with a clip limiter circuit, or an amplitude limiting circuit. The process 800, in whole or in part, can be implemented by, the voltage controlled amplifier 300, or any of the other embodiments described herein, such as the voltage controlled amplifier 500. Although some elements of the process 800 may be implemented by a number of different systems, to simplify discussion elements of the process 800 will be described with respect to particular systems.

The process 800 begins at block 802 when, for example, the feedback control circuit 402 obtains a voltage measurement at a summing node 310 of an amplifier 302. Optionally, the feedback control circuit 402 obtains an alternative electrical measurement at the summing node 310. For example, the feedback control circuit 402 may obtain a current measurement.

At decision block 804, the feedback control circuit 402 determines whether the voltage measurement obtained at the block 802 satisfies a clipping threshold. The clipping threshold may be set at a voltage value at which an input signal, or an amplified version of the input signal amplified by the power amplifier 302, begins clipping. As previously described, clipping may refer to when the shape of the amplified output signal no longer matches the shape of the input signal because the attempted gain applied to the input signal exceeds that which can be handled by the amplifier. Further, as previously described, in some optional cases, the clipping threshold may be a threshold that is lower than a point at which the power amplifier 302 begins clipping an input signal or an amplified input signal amplified by the power amplifier 302. Optionally, as previously described, the clipping threshold may be based on other criteria in addition to or instead of clipping. For example, the clipping threshold may be based on a temperature of the circuit, and ambient temperature, supply voltage, or any other factor that may affect a desired maximum voltage gain supplied by the power amplifier 302.

If it is determined that the voltage measurement satisfies the clipping threshold indicating that the input signal supplied to the power amplifier 302 will be clipped or is likely to be clipped, the feedback control circuit 402 provides a control signal to a control input 308 of the amplitude limiting circuit 304 at block 806. In some cases, the control signal may be a high signal.

At block 808, the amplitude limiting circuit 304 provides a first signal based on the control signal to an inverting input of a first differential operational amplifier 312. This first signal may be equivalent to the control signal or may be a signal representative of the control signal.

At block 810, the amplitude limiting circuit 304 provides an output of the first differential operational amplifier 312 to a first transistor pair 314 activating the first transistor pair 314. As previously described, the first transistor pair 314 may be a pair of differential transistors.

At block 812, the amplitude limiting circuit 304 provides a second signal based on the first signal to an inverting input of a second differential operational amplifier 316. Optionally, in some cases, the second signal is the output of the first differential operational amplifier 312.

At block 814, the amplitude limiting circuit 304 provides an output of the second differential operational amplifier 316 to a second transistor pair 318 activating the second transistor pair 318. As previously described, the first transistor pair 318 may be a pair of differential transistors.

At block 816, the amplitude limiting circuit 304 provides a first output signal of the transistor network 320 to an inverting input of the amplifier 302. At block 818, the amplitude limiting circuit 304 provides a second output signal of the transistor network 320 to a noninverting input of the amplifier 302. Providing the first and second output signals to the power amplifier 302 may cause an attenuation of an input signal to the power amplifier 302. By attenuating the signal supplied to the power amplifier 302 the amplified signal of the power amplifier 302 also be attenuated causing the output signal to drop below a maximum supported amplitude. By dropping the output signal below the maximum supported amplitude, clipping may be reduced or prevented.

After completing operations associated with the block 818, the process 800 may end. Optionally, in some cases, the process 800 may repeat. In some cases, the process 800 may be performed continuously. In other cases, the process 800 may be performed intermittently. For example, the process 800 may be performed every millisecond, every 5 ms, 300 ms, every second, or after any other time interval.

If it is determined at the decision block 804 that the voltage measurement does not satisfy clipping threshold, the process 800 proceeds to the block 820. Determining that the voltage measurement does not satisfy the clipping threshold may include determining that the voltage measurement is below the clipping threshold. Optionally, if it was previously determined that the voltage measurement did satisfy the clipping threshold, the decision block 804 may include comparing the voltage measurement to a second clipping threshold that is lower than the clipping threshold. In some cases, an input signal may hover near a clipping threshold with the input signal moving above and below the clipping threshold a plurality of times during a particular time period. The repeated occurrence of a signal moving above and below a threshold causing a circuit to continuously reconfigure may be referred to as bouncing. Bouncing may be undesirable because it can prevent a circuit from reaching a steady state configuration. Advantageously, in some cases, by using a second clipping threshold that is lower than the clipping threshold after determining that the voltage measurement satisfies the clipping threshold, bouncing may be reduced or eliminated.

At the block 820, the amplitude limiting circuit 304 deactivates a transistor network 320 of the amplitude limiting circuit 304. Deactivating the transistor network 320 may include performing one or more operations similar to the operations associated with the blocks 806-818. However, with respect to the operations of the block 820, the control signal supplied to the amplitude limiting circuit 304 may differ (e.g., a low signal instead of a high signal) from that provided at the block 806. Further, instead of activating the first and second transistor pairs at the blocks 810 and 814 respectively, the block 820 may include deactivating the transistor pairs. Moreover, instead of providing a first and second output signal of the transistor network to the power amplifier 302, the block 820 may include ceasing to provide or not providing a signal to the power amplifier 302. The block 820 may be optional or omitted. For example, if a previous voltage measurement did not satisfy the clipping threshold, it may be the case that the transistor network of the amplitude limiting circuit 304 may already be inactive making the block 820 unnecessary in this particular case. The process 800 may then return to the block 802 to obtain a subsequent voltage measurement at the summing node 310 of the amplifier 302.

Terminology

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the inventions are not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A voltage controlled amplifier, comprising:
    a power amplifier in a primary signal path, the power amplifier configured to receive an input signal transmitted along the primary signal path and to amplify the input signal; and
    an amplitude limiting circuit in a secondary signal path that is configured to limit the gain of the power amplifier when active, wherein the amplitude limiting circuit comprises:
        a first differential transistor pair of a first type;
        a second differential transistor pair of a second type, wherein the first differential transistor pair and the second differential transistor pair are configured to attenuate the input signal provided to the power amplifier; and
        a control circuit configured to control operation of the first differential transistor pair and the second differential transistor pair based at least in part on a control signal, wherein the control signal indicates whether to attenuate the input signal, wherein the control circuit comprises an operational amplifier.

2. The voltage controlled amplifier of claim 1, wherein the first differential transistor pair comprises NPN transistors and the second differential transistor pair comprises PNP transistors.

3. The voltage controlled amplifier of claim 1, wherein a quiescent current of the amplitude limiting circuit is substantially less when the amplitude limiting circuit is not configured to attenuate the input signal than when the amplitude limiting circuit is configured to attenuate the input signal.

4. The voltage controlled amplifier of claim 3, wherein the quiescent current is at least one order of magnitude less when the amplitude limiting circuit is not configured to attenuate the input signal than when the amplitude limiting circuit is configured to attenuate the input signal.

5. The voltage controlled amplifier of claim 1, wherein the control circuit receives the control signal from a feedback control circuit that generates the control signal based on a voltage measurement at a summing point of the power amplifier.

6. The voltage controlled amplifier of claim 1, wherein the operational amplifier has a quiescent current that is at least one order of magnitude less than a quiescent current of the power amplifier.

7. The voltage controlled amplifier of claim 1, wherein the operation amplifier based current source comprises a Howland current source.

8. An audio amplifier system comprising:
    a power supply configured to power one or more voltage controlled amplifiers; and
    a voltage controlled amplifier of the one or more voltage controlled amplifiers, the voltage controlled amplifier comprising:
        a power amplifier in a first signal path, the power amplifier configured to receive an input signal transmitted along the first signal path and to amplify the input signal; and
        an amplitude limiting circuit in a second signal path that is configured to limit the gain of the power amplifier when in a first mode, wherein the amplitude limiting circuit comprises:
            a first differential transistor pair of a first type;
            a second differential transistor pair of a second type, wherein the first differential transistor pair and the second differential transistor pair are configured to attenuate the input signal provided to the power amplifier; and
            a control circuit configured to control operation of the first differential transistor pair and the second differential transistor pair based at least in part on a control signal corresponding to the first mode or a second mode, wherein a quiescent current of the amplitude limiting circuit is substantially less when operating in the second mode than when operating in the first mode.

9. The audio amplifier system of claim 8, wherein the amplitude limiting circuit is further configured to not limit the gain of the power amplifier when in the second mode.

10. The audio amplifier system of claim 8, further comprising a feedback control circuit configured to generate the control signal based at least in part on an electrical measurement at a summing point of the power amplifier.

11. The audio amplifier system of claim 8, wherein the second signal path-does not impede communication of the input signal along the first signal path.

12. The audio amplifier system of claim 8, wherein the control circuit comprises an operational amplifier that controls operation of the first differential transistor pair, and wherein the operational amplifier has a lower quiescent current than the power amplifier.

13. A method of controlling a voltage controlled amplifier, the method comprising:
    obtaining a voltage measurement at a summing point of a power amplifier of the voltage controlled amplifier;
    determining that the voltage measurement satisfies a clipping threshold;
    providing a control signal to a control input of a voltage limiting circuit of the voltage controlled amplifier, the control signal based at least in part on the voltage measurement;
    providing a first output signal of the voltage limiting circuit to a non-inverting input of the power amplifier; and
    providing a second output signal of the voltage limiting circuit to an inverting input of the power amplifier, wherein the first output signal and the second output signal causes an amplitude of an output of the power amplifier to be reduced.

14. The method of claim 13, wherein the clipping threshold is set to a first threshold when a set of one or more criteria satisfies a first set of conditions and is set to a second threshold when the set of one or more criteria satisfies a second set of conditions.

15. The method of claim 13, wherein, when the voltage measurement does not satisfy the clipping threshold, the method further comprises causing the voltage limiting circuit to enter a low-power mode by setting the control signal to a low-power mode value.

16. The method of claim 15, wherein, when receiving the control signal set to the low-power mode, the voltage limiting circuit deactivates a transistor network of the voltage limiting circuit, wherein the transistor network generates the first output signal and the second output signal.

17. The method of claim 13, further comprising:
generating the first output signal by at least applying an activation signal to a pull down resistor causing a first differential transistor pair to generate the first output signal; and
generating the second output signal by at least:
inverting the activation signal; and
applying the inverted activation signal to a pull up resistor causing a second differential transistor pair to generate the second output signal.

18. The audio amplifier system of claim 8, wherein the quiescent current of the amplitude limiting circuit is at least one order of magnitude less when operating in the second mode than when operating in the first mode.

19. The audio amplifier system of claim 8, wherein the quiescent current of the amplitude limiting circuit is 0.2 mA or less when operating in the second mode and greater than 0.2 mA when operating in the first mode.

* * * * *